(12) United States Patent
Suhir

(10) Patent No.: US 6,180,241 B1
(45) Date of Patent: Jan. 30, 2001

(54) ARRANGEMENT FOR REDUCING BENDING STRESS IN AN ELECTRONICS PACKAGE

(75) Inventor: Ephraim Suhir, Randolph, NJ (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/135,969

(22) Filed: Aug. 18, 1998

(51) Int. Cl.[7] ............................. B32B 15/08; B32B 27/38
(52) U.S. Cl. ........................ 428/418; 428/212; 428/913; 156/242; 156/297
(58) Field of Search .................................. 428/698, 701, 428/702, 451, 212, 418, 901, 913; 257/687, 678, 701, 703, 704, 706, 707, 787; 438/15, 106; 156/242, 297

(56) References Cited

U.S. PATENT DOCUMENTS

| | | | |
|---|---|---|---|
| 4,025,997 | 5/1977 | Gernitis et al. | 428/621 |
| 4,287,495 | 9/1981 | Lund, Jr. et al. | 333/239 |
| 4,875,282 | 10/1989 | Leibowitz | 29/830 |
| 5,095,632 | 3/1992 | Hassler, Jr. et al. | 33/493 |
| 5,102,836 | 4/1992 | Brown et al. | 501/104 |
| 5,173,840 | 12/1992 | Kodai et al. | 361/395 |
| 5,213,864 | 5/1993 | Wong | 428/76 |
| 5,224,017 | 6/1993 | Martin | 361/388 |
| 5,322,559 | 6/1994 | Sleight | 106/401 |
| 5,416,867 | 5/1995 | Thorsten et al. | 385/73 |
| 5,433,778 | 7/1995 | Sleight | 106/401 |
| 5,493,153 * | 2/1996 | Arikawa et al. | 257/796 |
| 5,497,616 | 3/1996 | Roberts | 60/261 |
| 5,514,360 | 5/1996 | Sleight et al. | 423/2 |
| 5,523,893 | 6/1996 | Haas | 359/820 |
| 5,525,839 * | 6/1996 | Shu | 257/780 |
| 5,557,066 * | 9/1996 | Rostoker et al. | 174/52.4 |
| 5,557,474 | 9/1996 | McCrary | 359/820 |
| 5,573,172 | 11/1996 | Gore | 228/180.22 |
| 5,589,807 | 12/1996 | Tang | 333/212 |
| 5,627,407 | 5/1997 | Suhir et al. | 257/701 |
| 5,694,503 | 12/1997 | Fleming et al. | 385/37 |
| 5,710,648 | 1/1998 | Frigo | 359/110 |

FOREIGN PATENT DOCUMENTS

| | | |
|---|---|---|
| 403194951 * | 8/1991 | (JP). |
| 405003265 * | 1/1993 | (JP). |
| 407153878 * | 6/1995 | (JP). |

OTHER PUBLICATIONS

Negative Therman Expanision from 0.3 to 1050 Kelvin in $ZrW_2O_8$ —Science vol. 272—Apr. 5, 1996 —p. 90–92.
Linear Thermal Expansion of Three Tungstates, C. Martinek and F. A. Hummel Journal of The American Ceramic Society–Discussion and Notes—Apr. 1968 p. 227–228.
Negative Thermal Expansion in $ZrW_2O_8$—J.S.O. Evans et al.—Chem. Mater., vol. 8, Nov. 12, 1996 p. 2809–2823.

* cited by examiner

*Primary Examiner*—Deborah Jones
*Assistant Examiner*—Stephen Stein
(74) *Attorney, Agent, or Firm*—David L. Davis

(57) ABSTRACT

An electronics package consisting of a molded plastic body on a ceramic substrate is provided with a layer of a ceramic surrogate material on a surface of the plastic body opposite the ceramic substrate to reduce bending stress of the package. The coefficient of thermal expansion of the ceramic surrogate layer is less than that of the ceramic substrate. Equations are developed for determining an optimum thickness for the surrogate layer.

4 Claims, 1 Drawing Sheet

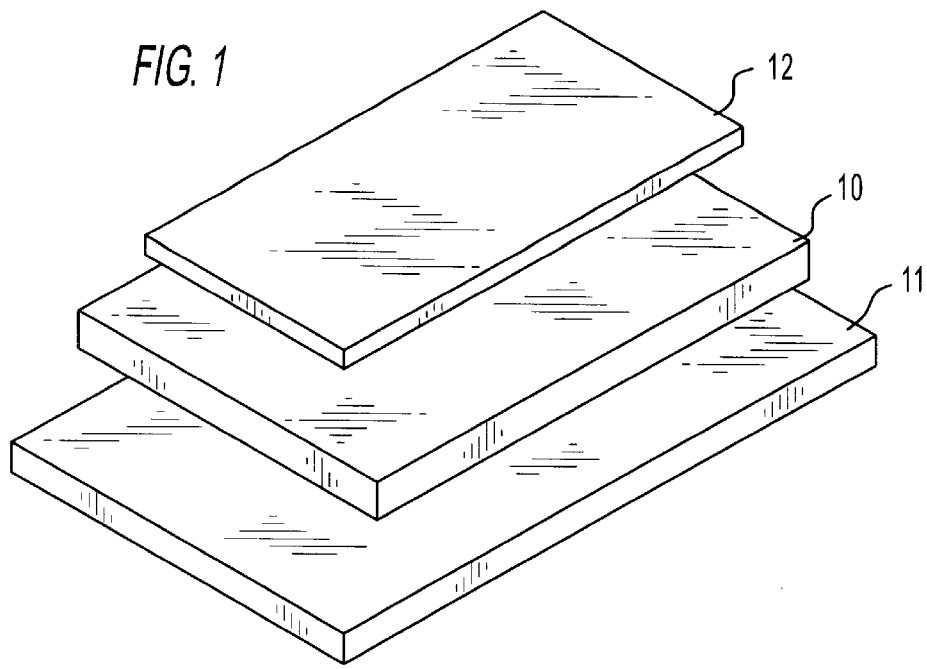
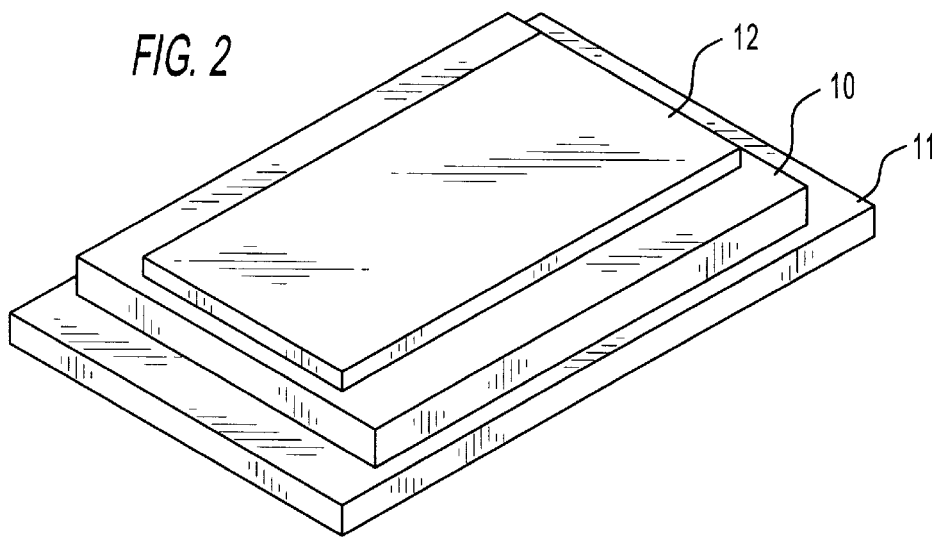
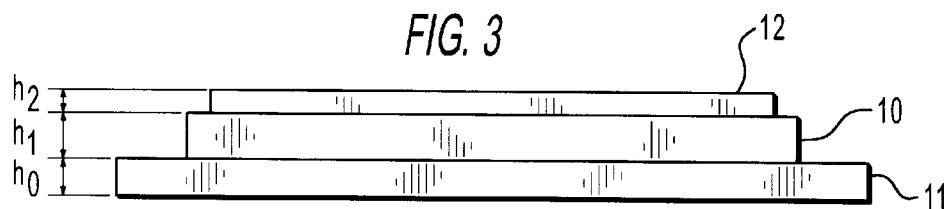

ARRANGEMENT FOR REDUCING BENDING STRESS IN AN ELECTRONICS PACKAGE

BACKGROUND OF THE INVENTION

This invention relates to the packaging of electronic components and, more particularly, to a package with reduced bending stress due to temperature change.

Some microelectronic package designs employ a thick plastic body molded on a thin substrate. A good example is a package in which a thin ceramic substrate is overmolded with an epoxy compound which encapsulates microelectronic components surface-mounted on the substrate. This substrate, since it is made of a brittle material, is prone to failure, because of the thermal contraction mismatch of the molding compound with the ceramic material as the package cools from its molding temperature to room temperature conditions.

The situation can be improved in many ways. For example, as disclosed in U.S. Pat. No. 5,627,407, an additional "surrogate" material (i.e., a material not needed from the standpoint of the normal operation of the package) can be applied to the outer surface of the substrate to "balance" the package bowing. Clearly, such a surrogate layer should be thin (in order not to interfere with the normal function of the electronic component, and not to make the package thicker than necessary), have a high coefficient of thermal expansion (CTE) and a high Youngs's modulus (to be effective) and, in addition, should be able to withstand high tensile stresses on both a short term and a long term basis. One could select, for example, a thermoplastic sheet that softens at the molding temperature and bonds well to the substrate, or a rigid material with an adhesive layer that bonds to the substrate during molding. This approach, based on the employment of a polymeric material molded concurrently with the "main" package, has, however, the following major shortcomings:

There are not too many polymer materials which have high CTE, high Young's modulus, high adhesive and cohesive strength and, at the same time, have a molding Temperature the same as the "basic" molding compound; and There is a concern that this material can fail in the long-run, either adhesively or cohesively, because of acing, high tensile stresses, moisture-absorption, etc.

It would therefore be desirable to provide an alternative solution to the problem of reducing the package bow using a surrogate material.

SUMMARY OF THE INVENTION

In accordance with the present invention, a surrogate layer of a low CTE ceramic component (even in some cases a component made of negative CTE ceramic) is applied to the outer ("free") surface of the molded plastic body.

In accordance with an aspect of this invention, the surrogate material (layer) is applied during manufacturing (molding) of the basic package.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 1 is an exploded perspective view of an electronics package embodying this invention;

FIG. 2 is a perspective view of the package shown in FIG. 1 with its components in place; and FIG. 3 is a side view of the package shown in FIG. 2.

DETAILED DESCRIPTION

This description is divided into two parts. Part I describes the general features of a package using a surrogate layer according to the present invention to reduce bending stress, and Part II presents an analytical model useful for optimizing the surrogate layer in various applications.

I. The Features of the Package

Referring to the drawings, FIG. 1 is an exploded view showing the three main components of an electronic package in accordance with the invention. Specifically, the package comprises a body of molded plastic 10, such as a thermosetting epoxy molding compound, a main insulating substrate 11 and a surrogate layer 12. The molded plastic body 10 typically encapsulates one or more electronic devices such as integrated circuits (not shown). The main substrate 11 is typically a fragile material such as an insulating ceramic which needs to be protected from bending stresses. According to the present invention, the surrogate layer is a thin ceramic layer.

As better shown in FIG. 2, the surrogate layer 12 is disposed on the side of the molded plastic body 10 opposite the main substrate 11. The structure is advantageously fabricated in such a fashion that both the surrogate layer 12 and the main substrate 11 bond to the plastic body 10 during the molding of the plastic body 10. This concurrent fabrication creates a desirable stress balance in the composite structure during cooling.

The analysis that follows presents a calculation procedure to determine the required thickness of the surrogate layer 12 to balance the stress in the main substrate 11. It is assumed that the plastic body 10, the main substrate 11 and the surrogate layer 12 are molded concurrently.

II. Analytical Model

The following analysis considers an ideal tri-material structure similar to that shown in FIG. 2. The structure consists of an epoxy molded body 10, a ceramic substrate 11 and a ceramic surrogate layer 12, molded together at the elevated molding temperature of the body 10 and subsequently cooled to room temperature. In the following discussion, the subscript 0 refers to the ceramic substrate 11, the subscript 1 refers to the body 10, and the subscript 2 refers to the ceramic surrogate layer 12.

Let a tri-material elongated assembly be manufactured at an elevated temperature and subsequently cooled to a low (say, room) temperature. The induced forces in the assembly components can be determined from the equations of the compatibility of the interfacial strains $$-\alpha_0\Delta t+\lambda_0 T_0 = -\alpha_1\Delta t+\lambda_1 T_1 = -\alpha_2\Delta t+\lambda_2 T_2 \qquad (1)$$

and the equilibrium equation $$T_0+T_1+T_2=0, \qquad (2)$$

where $\alpha_0$, $\alpha_2$ and $\alpha_2$ are the CTE of the ceramic substrate 11, the body 10, and the ceramic surrogate layer 12, respectively;

$$\lambda_0 = \frac{1}{E_0 h_0}, \lambda_1 = \frac{1}{E_1 h_1}, \lambda_2 = \frac{1}{E_2 h_2} \qquad (3)$$

are the compliances of the corresponding components; $h_0$, $h_1$ and $h_2$ are their thicknesses; $E_0$, $E_1$ and $E_2$ are generalized Young's module (i.e., Young's module obtained by dividing actual Young's module by $1-\nu$, where $\nu$ is Poisson's ratio of the material); $\Delta t$ is the change in temperature; and $T_0$, $T_1$ and $T_2$ are the induced forces.

From equations (1) and (2) we obtain the following equations for the forces acting in the ceramic substrate 11 and the ceramic surrogate layer 12:

$$T_0 = \frac{\Delta t}{D}[\alpha_0(\lambda_1 + \lambda_2) - \alpha_1\lambda_2 - \alpha_2\lambda_1] \quad \quad (4)$$
$$T_2 = -\frac{\Delta t}{D}[\alpha_0\lambda_1 + \alpha_1\lambda_0 - \alpha_2(\lambda_0 + \lambda_1)]$$

where $$D = \lambda_0\lambda_1 + \lambda_1\lambda_2 + \lambda_0\lambda_2 \quad \quad (5)$$

is the determinant of the system of equations (1) and (2). Using equation (3), one can write the equations (4) as follows:

$$T_0 = -\frac{\Delta t}{D_1}E_0 h_0[-\alpha_0(E_1 h_1 + E_2 h_2) + \alpha_1 E_1 h_1 + \alpha_2 E_2 h_2] \quad (6)$$
$$T_2 = -\frac{\Delta t}{D_1}E_2 h_2[\alpha_0 E_0 h_0 + \alpha_1 E_1 h_1 - \alpha_2(E_0 h_0 + E_1 h_1)]$$

where the following notation is used:

$$D_1 = E_0 h_0 + E_1 h_1 + E_2 h_2. \quad \quad (7)$$

Obviously, no bow can occur if the moment $$M_0 - T_0 \frac{h_0 + h_1}{2}$$

applied to the molded body 10 by the ceramic substrate 11 is in equilibrium with (i.e., equal and opposite to) the moment $$M_2 - T_2 \frac{h_1 + h_2}{2}$$

applied to the molded body 10 by the ceramic surrogate layer 12. This yields:

$$T_0(h_0 + h_1) - T_2(h_1 + h_2) = 0 \quad \quad (8)$$

Introducing equation (6) into equation (8), we obtain the condition of zero bow in the form:

$$E_2[(\alpha_0 - \alpha_2)E_0 h_0 + (\alpha_1 - \alpha_2)E_1 h_1]h_2^2 + E_2[(\alpha_0 - \alpha_2)(h_0 + 2h_1)E_0 h_0 + (\alpha_1 - \alpha_2)E_1 h_1^2]h_2$$
$$-E_0 h_0 E_1 h_1 (h_0 + h_1)(\alpha_1 - \alpha_0) = 0$$

This expression results in the following quadratic equation for the dimensionless thickness ($\eta_2 = h_2/h_0$) of the ceramic surrogate layer 12:

$$\eta_2^2 + 2\gamma\eta_2 - \delta = 0 \quad \quad (9)$$

where the following notation is used:

$$\gamma = \frac{(1 - \overline{\alpha}_2)(1 + 2\eta_1) + (\overline{\alpha}_1 - \overline{\alpha}_2)e_1\eta_1^2}{2[1 - \overline{\alpha}_2 + (\overline{\alpha}_1 - \overline{\alpha}_2)e_1\eta_1]} \quad (10)$$
$$\delta = \frac{(\overline{\alpha}_1 - 1)e_1\eta_1(1 + \eta_1)}{e_2[1 - \overline{\alpha}_2 + (\overline{\alpha}_1 - \overline{\alpha}_2)e_1\eta_1]}$$

and $$\eta_1 = \frac{h_1}{h_0}, \eta_2 = \frac{h_2}{h_0}, e_1 = \frac{E_1}{E_0}, e_2 = \frac{E_2}{h_0}, \overline{\alpha}_1 = \frac{\alpha_1}{\alpha_2}, \overline{\alpha}_2 = \frac{\alpha_2}{\alpha_0} \quad (11)$$

From equation (9) we find:

$$\eta_2 = \gamma\left(\sqrt{1 + \frac{\delta}{\gamma^2}} - 1\right) \quad (12)$$

In the simplest case, when the ceramic surrogate material has the same properties as the ceramic substrate material ($e_2 = 1, \overline{\alpha}_2 = 1$), this equation yields: $\eta_2 = 1$. The equation (12) enables one to compute the thickness of the surrogate layer for the given materials, and the given thicknesses of the molding compound and the ceramic substrate. The effect of the application of a low expansion ceramic as a surrogate layer can be enhanced, of course, if a ceramic with a negative CTE is employed.

Let, for example, the generalized Young's module of the materials be $E_0 = 14000$ kgf/mm$^2$, $E_1 = 1400$ kgf/mm$^2$, $E_2 = 14000$ kgf/mm$^2$, their CTE's be $\alpha_0 = 6 \times 10^{-6}/°$ C., $\alpha_1 = 18 \times 10^{-6}/°$ C., $\alpha_2 = 10^{-6}/°$ C., and the thicknesses of the material layers in the package be $h_0 = 1.0$ mm and $h_1 = 4.0$ mm. Then the equations (11) result in the following dimensionless parameters: $\eta_1 = 4$; $e_1 = 0.1$; $e_2 = 1.0$; $\overline{\alpha}_1 = 3.000$; $\overline{\alpha}_2 = 0.167$. From equation (10) we find: $\gamma = 3.0593$ and $\delta = 2.039$, and the equation (12) yields: $\eta_2 = 0.3161$. Hence, $h_2 = \eta_2 h_0 = 0.316$ mm. The surrogate layer can be made even thinner, if a ceramic material with negative CTE is used. Let, for instance, $\alpha_2 = -1.5 \times 10^{-6}/°$ C. Then we obtain: $\overline{\alpha}_2 = -1.0$; $\gamma = 3.3889$; $\delta = 1.1111$; $\eta_2 = 0.1601$; $h_2 = 0.160$ mm.

Accordingly, there has been disclosed an improved electronics package with reduced bending stress. It is to be understood that the above-described embodiments are illustrative of only a few of the many possible specific embodiments which can represent applications of the principles of the invention. Numerous and varied other arrangements can be made by those skilled in the art without departing from the spirit and scope of the invention, as defined by the appended claims.

What is claimed is:

1. A package for electronic components comprising a ceramic substrate and a body of molded plastic on a surface of said substrate, wherein said body has at least one electronic component imbedded therein, wherein said body has a pair of substantially planar opposed major surfaces, wherein said body is bonded along one of said body major surfaces to said surface of said substrate during the molding of said body at the molding temperature of said plastic, and wherein said molded plastic body has a coefficient of thermal expansion greater than the coefficient of thermal expansion of said ceramic substrate so that said substrate is subject to bending stress caused by thermal expansion mismatch with said molded plastic body, wherein the improvement comprises:

a surrogate layer bonded to said molded plastic body along the other major surface of said body, wherein said surrogate layer is formed of a ceramic material having a coefficient of thermal expansion less than the coefficient of thermal expansion of said ceramic substrate.

2. The improvement according to claim 1 wherein said ceramic surrogate layer has a negative coefficient of thermal expansion.

3. A method for reducing the bending stress applied to a ceramic substrate when cooled to a steady state temperature below the molding temperature of a molded plastic body bonded to a surface of the ceramic substrate during the molding of the body, comprising the steps of:

a) selecting a ceramic surrogate material having a coefficient of thermal expansion which is less than the coefficient of thermal expansion of the ceramic substrate; and b) applying a layer of the ceramic surrogate material to the molded plastic body opposite the ceramic substrate during the molding of the body at the molding temperature.

4. The method according to claim 3 further comprising the step of:

c) calculating the thickness of the applied ceramic surrogate material layer so that at the steady state temperature the induced moment applied to the molded plastic body by the ceramic surrogate material layer is equal and opposite to the induced moment applied to the molded plastic body by the ceramic substrate.

* * * * *